United States Patent [19]

Russell et al.

[11] Patent Number: 4,694,555
[45] Date of Patent: Sep. 22, 1987

[54] ASSEMBLIES FOR SUPPORTING ELECTRICAL CIRCUIT BOARDS WITHIN TUBES AND METHOD OF USING SAME

[75] Inventors: Michael K. Russell, Prestbury; Donald L. Wesenberg, Northleach; Peter A. Leaney, Cheltenham, all of England

[73] Assignee: NL Industries, Inc., New York, N.Y.

[21] Appl. No.: 854,367

[22] Filed: Apr. 21, 1986

[30] Foreign Application Priority Data

Feb. 7, 1986 [GB] United Kingdom ............... 8603122

[51] Int. Cl.⁴ ............................................... B23P 11/02
[52] U.S. Cl. ................................. 29/451; 29/455 R;
29/458; 174/52 R; 361/395
[58] Field of Search ............ 29/450, 451, 458, 455 R;
174/52 R, 68.5; 361/386, 395, 399, 415, 400

[56] References Cited

U.S. PATENT DOCUMENTS

| | | | |
|---|---|---|---|
| 3,083,259 | 3/1963 | Wells | 174/68.5 |
| 3,539,874 | 11/1970 | Swanson | 174/52 R X |
| 3,847,703 | 12/1974 | Kaiser | 29/451 X |
| 3,953,662 | 4/1976 | Nagashima et al. | 174/52 R X |
| 4,400,858 | 8/1983 | Goiffon et al. | 361/386 X |
| 4,447,842 | 5/1984 | Berg | 361/386 |
| 4,521,829 | 6/1985 | Wessely | 361/386 X |
| 4,536,710 | 8/1985 | Dunham | 361/400 X |
| 4,547,833 | 10/1985 | Sharp | 174/52 R X |
| 4,577,386 | 3/1986 | Faudou | 29/455 R |
| 4,633,248 | 12/1986 | Small | 361/394 X |

FOREIGN PATENT DOCUMENTS

| | | |
|---|---|---|
| 940417 | 10/1963 | United Kingdom . |
| 964861 | 7/1964 | United Kingdom . |
| 1409717 | 10/1975 | United Kingdom . |

Primary Examiner—Charlie T. Moon
Attorney, Agent, or Firm—Browning, Bushman, Zamecki & Anderson

[57] ABSTRACT

An electrical circuit board is supported within a tube by means of an aluminum support spine of semicircular section. The circuit board is mounted on the flat surface of the spine with a continuous layer of vibration-absorbing material between the circuit board and the spine. On the opposite side of the circuit board are a number of regularly spaced aluminum posts capped with rubber bumpers for engaging the inside surface of the tube. In order to hold the assembly within the tube and to absorb shocks, two rubber tubular members are disposed in grooves in the spine parallel to the longitudinal axis. The assembly may be introduced into the tube with the tubular members in a relatively contracted state and may subsequently be held firmly in position within the tube with the tubular members in a relatively expanded state.

9 Claims, 2 Drawing Figures

ASSEMBLIES FOR SUPPORTING ELECTRICAL CIRCUIT BOARDS WITHIN TUBES AND METHOD OF USING SAME

BACKGROUND OF THE INVENTION

This invention relates to assemblies for supporting electrical circuit boards within tubes, and is concerned more particularly, but not exclusively, with assemblies for supporting circuit boards within measurement probes to be accommodated down-hole in a borehole such that the circuit boards are substantially resistant to mechanical vibration and shock.

In the surveying of boreholes various measurements are taken down-hole and are processed prior to being transmitted to the surface, for example by means of a mud-pulse signalling transmitter. The appropriate measuring instrumentation and processing circuitry is mounted within a drill collar incorporated in the drill string in the vicinity of the drill bit. More particularly the circuit boards accommodating the measurement and processing circuitry are supported within an elongate tube which is in turn mounted within a sleeve by means of a pivotal coupling at one end to allow limited pivotal movement of the probe within the speeve. The sleeve is then itself mounted within the drill collar with the interposition of a suitable damping medium between the outside of the sleeve and inside wall of the drill collar.

It is an object of the invention to provide an assembly for supporting an electrical circuit within a tube which is suitable for use in such a measurement probe.

SUMMARY OF THE INVENTION

According to one aspect of the invention, there is provided an assembly for supporting an electrical circuit board within a tube, the assembly comprising the circuit board, a support spine supporting the circuit board, and shock-absorbing means for holding the assembly within the tube, wherein a layer of vibration-absorbing material is interposed between the circuit board and the spine.

The vibrating-absorbing layer preferably extends continuously from one end to the other of the circuit board so as to support substantially the complete length of the circuit board, and is conveniently an elastomeric layer.

Such an arrangement provides a dual mechanism for isolating the circuit board to a substantial extent from mechanical vibration and shock.

According to another aspect of the invention, there is provided an assembly for supporting an electrical circuit board within a tube, the assembly comprising the circuit board, a support spine supporting the circuit board, and shock-absorbing means for holding the assembly within the tube, wherein the shock-absorbing means includes at least one tubular member the outside diameter of which can be changed, by varying the internal pressure of the tubular member, between a relatively contracted state in which the assembly can be inserted into the tube from one end and a relatively expanded state in which the assembly is subsequently held firmly within the tube.

In one embodiment of the invention, the or each tubular member is normally sufficiently incompressible to hold the assembly firmly within the tube, and is contractible by evacuation of the interior of the tubular member to enable the assembly to be inserted into the tube from one end.

In an alternative embodiment, the or each tubular member is normally sufficiently compressible to enable the assembly to be inserted into the tube from one end, and is expandable by application of pressure to the interior of the tubular member to hold the assembly firmly within the tube.

The or each tubular member is advantageously held in position by being accommodated within a groove in the spine. Furthermore, the spine is conveniently substantially semicircular in section with a curved surface having an outer radius matching the inner radius of the tube within which the assembly is to be accommodated and a flat surface for supporting the circuit board.

In a preferred arrangement, the assembly further includes support posts for acting between the circuit board and the inside wall of the tube on the opposite side of the circuit board to the support spine. The posts are conveniently spaced at equal intervals along the central longitudinal axis of the circuit board.

In addition the shock-absorbing means preferably includes two tubular members having their longitudinal axes disposed parallel to, and symmetrically with respect to, a plane perpendicular to the circuit board and passing through the central longitudinal axis of the circuit board.

The invention also provides a method of inserting an electrical circuit board support assembly into a tube, wherein the assembly comprises a circuit board and a support spine supporting the circuit board, which method comprises providing shock-absorbing means in a position on the assembly to engage the inside wall of the tube, the shock-absorbing means being in the form of at least one tubular member the outside diameter of which can be changed by varying the internal pressure of the tubular member, inserting the assembly into the tube with the or each tubular member in a relatively contracted state corresponding to a first internal pressure, and holding the assembly firmly within the tube with the or each tubular member in a relatively expanded state corresponding to a second internal pressure.

BRIEF DESCRIPTION OF THE DRAWING

In order that the invention may be more fully understood, a preferred embodiment of the invention will now be described, by way of example, with reference to the accompanying drawing, in which.

DETAILED DESCRIPTION OF THE DRAWING

Figure 1:
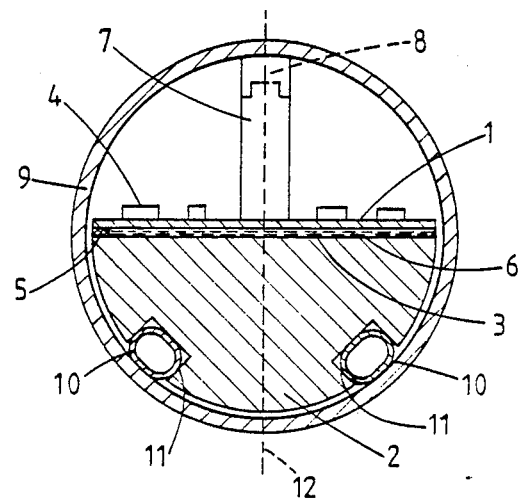
FIG. 1 is a cross-section of the assembly within a tube.
Figure 2:
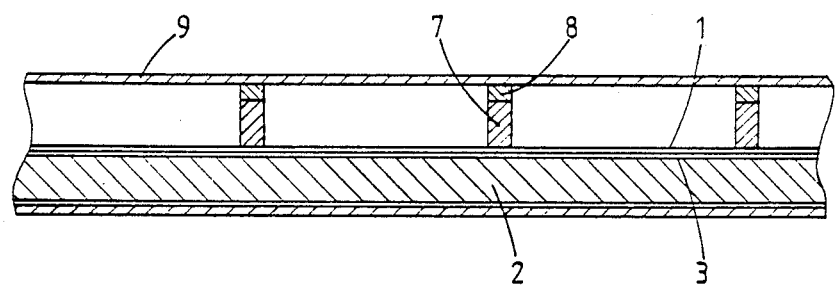
FIG. 2 is a longitudinal section, on a smaller scale, through part of the assembly and tube.

Referring to the drawing, the illustrated assembly comprises several electrical circuit boards 1, of which only one is shown in the drawing, an aluminum support spine 2 of semicircular section, and a layer 3 of vibration-absorbing material intermediate the circuit boards 1 and the spine 2. Each of the boards 1 is a conventional printed circuit board on which are mounted a number of electrical components 4. For ease of fabrication the layer 3 comprises a fillet 5 of a thixotropic elastomer, and a layer 6 of a silicon elastomer of 40 durometer hardness, such as an RTV type material. During fabrication of the assembly, the board 1 and spine 2 are maintained the required distance apart, and the fillet 5 is formed by applying the thixotropic elastomer to the assembly to seal one side of the gap between the board 1 and spine 2. The material of the fillet 5 sets rapidly, and serves to close off the gap on one side whilst free-flowing silicon elastomer is introduced to fill the remainder of the gap and sets to form the completed layer 3.

The assembly additionally includes a number of aluminum posts 7 capped with rubber bumpers 8. The posts 7 are disposed at regular intervals along the length of each board 1. Additionally, in order to hold the assembly within the tube 9, the arrangement includes two rubber tubular members 10 disposed in grooves 11 in the spine 2 parallel to, and symmetrically disposed with respect to, a plane 12 (shown by a broken line in FIG. 1) perpendicular to the board 1 and passing through the central longitudinal axis of the board 1.

In a first insertion method, the assembly is introduced into the tube 9, and, after positioning the assembly as required within the tube 9, air pressure is applied to the tubular members 10 to cause the tubular members 10 to expand and lock the assembly within the tube 9. The applied pressure can be maintained within the tubular members 10 by closing off the ends of the members.

In an alternative insertion method, the tubular members 10 are normally of sufficient size and sufficiently incompressible to prevent the assembly from being inserted within the tube 9. To enable insertion the tubular membesr 10 are evacuated so as to contract the tubular members and enable the assembly to be inserted into the correct position within the tube 9. Subsequently the vacuum is released so that the tubular members 10 assume their previous states and serve to lock the assembly firmly within the tube 9.

The above described arrangement is particularly advantageous as it renders the circuit boards substantially resistant to failure due to mechanical vibration and shock down-hole. More particularly the arrangement is capable of withstanding high vibration levels up to a frequency of the order of 1 KHz, due to the fact that the maximum strains between the components and the boards are kept within levels which should ensure freedom from fatigue failures. The layer 3 provides a continuous elastic foundation for supporting the boards which has the effect of rendering the lowest mode natural frequency of each board very substantially above 1 KHz. The complete assembly is resiliently supported within the tube 9 by the tubular members 10 which run the complete length of the spine 2 and by the intermittently spaced posts 7 whose rubber caps 8 serve as the third stabilising leg of the support system. The tubular members 10 reliably maintain separation between the metal spine 2 and the metal wall of the tube 9, and provide resistance to shock.

Various modifications can be made to the above described arrangement without departing from the scope of the invention. For example the two tubular members 10 may be replaced by a single tubular member accommodated within a single groove in the spine 2 at the position where the plane 12 meets the outer periphery of the spine 2. Also, instead of the boards being supported by a continuous layer of elastomeric material, each board may be supported only by a fillet at each of its four edges, although it will be appreciated that such an arrangement will not be as efficient in increasing the minimum natural frequency of the boards. Moreover the vibration-absorbing layer 6 may have a hardness in the range of 30 to 70 durometers.

We claim:

1. An assembly for supporting an electrical circuit board within a tube, the assembly comprising the circuit board, an elongated support spine supporting the circuit board, and shock-absorbing means for holding the assembly within the tube, wherein the shock-absorbing means includes longitudinally along said spine exterior at least one elongated tubular member the outside diameter of which can be changed, by varying the internal pressure of the tubular member, between a relatively contracted state in which the assembly can be inserted into the tube from one end and a relatively expanded state in which the assembly is subsequently held firmly within the tube.

2. An assembly according to claim 1, wherein the or each tubular member is normally sufficiently incompressible to hold the assembly firmly within the tube, and is contractible by evacuation of the interior of the tubular member to enable the assembly to be inserted into the tube from one end.

3. An assembly according to claim 1, wherein the or each tubular member is normally sufficiently compressible to enable the assembly to be inserted into the tube from one end, and is expandable by application of pressure to the interior of the tubular member to hold the assembly firmly within the tube.

4. An assembly according to claim 1, wherein the or each tubular member is held in position by being accommodated within a groove in the spine.

5. An assembly according to claim 1, wherein the spine is substantially semicircular in section with a curved surface having an outer radius matching the inner radius of the tube within which the assembly is to be accommodated and a flat surface for supporting the circuit board.

6. An assembly according to claim 1, which further includes support posts for acting between the circuit board and the inside wall of the tube on the opposite side of the circuit board to the support spine.

7. An assembly according to claim 6, wherein the posts are spaced at equal intervals along the central longitudinal axis of the circuit board.

8. An assembly according to claim 1, wherein the shock-absorbing means includes two tubular members having their longitudinal axes disposed parallel to, and symmetrically with respect to, a plane perpendicular to the circuit board and passing through the central longitudinal axis of the circuit board.

9. A method of inserting an electrical circuit board support assembly into a tube, wherein the assembly comprises an elongated circuit board and a support spine supporting the circuit board, which method comprises providing shock-absorbing means in a position on the spine to engage the inside wall of the tube, the shock-absorbing means includes longitudinally along said spine exterior at least one elongated tubular member the outside diameter of which can be changed by varying the internal pressure of the tubular member, inserting the assembly into the tube with the or each tubular member in a relatively contracted state corresponding to a first internal pressure, and holding the assembly firmly within the tube with the or each tubular member in a relatively expanded state corresponding to a second internal pressure.

* * * * *